United States Patent
Hironaka

(10) Patent No.: US 8,773,150 B2
(45) Date of Patent: Jul. 8, 2014

(54) VEHICLE CRASH DETECTION DEVICE

(75) Inventor: Ryouji Hironaka, Gamagoori (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 103 days.

(21) Appl. No.: 13/636,215

(22) PCT Filed: Apr. 18, 2011

(86) PCT No.: PCT/JP2011/059515
§ 371 (c)(1),
(2), (4) Date: Sep. 20, 2012

(87) PCT Pub. No.: WO2012/143987
PCT Pub. Date: Oct. 26, 2012

(65) Prior Publication Data
US 2013/0147498 A1    Jun. 13, 2013

(51) Int. Cl.
*G01R 27/08* (2006.01)

(52) U.S. Cl.
USPC ........... 324/705; 324/207.15; 324/207.11; 324/750.01; 280/734; 280/735; 180/274; 340/436; 701/45; 701/46; 701/31.9; 701/29.2; 73/12.01

(58) Field of Classification Search
USPC .......... 324/705, 207.15, 207.11, 750.01, 555; 701/45, 46, 31.9, 29.2; 280/734, 735; 180/274; 340/436; 73/12.01
See application file for complete search history.

(56) References Cited

U.S. PATENT DOCUMENTS

| | | | |
|---|---|---|---|
| 4,995,639 A * | 2/1991 | Breed | 280/735 |
| 6,127,741 A * | 10/2000 | Matsuda et al. | 307/36 |
| 6,393,892 B1 | 5/2002 | Ohbayashi et al. | |
| 8,186,471 B2 * | 5/2012 | Ohno | 180/274 |
| 2001/0028163 A1 * | 10/2001 | Breed | 280/735 |
| 2004/0064230 A1 * | 4/2004 | Takafuji et al. | 701/45 |
| 2004/0108157 A1 * | 6/2004 | Takafuji et al. | 180/274 |
| 2005/0021192 A1 * | 1/2005 | Takafuji et al. | 701/1 |
| 2005/0096816 A1 * | 5/2005 | Takafuji et al. | 701/45 |
| 2005/0154530 A1 * | 7/2005 | Hosokawa et al. | 701/301 |
| 2007/0102220 A1 * | 5/2007 | Kiribayashi | 180/274 |
| 2009/0014228 A1 * | 1/2009 | Kawaura et al. | 180/274 |
| 2009/0057109 A1 * | 3/2009 | Bour et al. | 200/61.44 |
| 2009/0143933 A1 * | 6/2009 | Kawaura et al. | 701/29 |

FOREIGN PATENT DOCUMENTS

| | | |
|---|---|---|
| JP | 05312826 A | 11/1993 |
| JP | 0653976 U | 7/1994 |
| JP | 07-272130 A | 10/1995 |
| JP | 2001133472 A | 5/2001 |

(Continued)

OTHER PUBLICATIONS

International Search Report of PCT/JP2011/059515 dated Jul. 19, 2011.

*Primary Examiner* — Tung X Nguyen
*Assistant Examiner* — Thang Le
(74) *Attorney, Agent, or Firm* — Sughrue Mion, PLLC

(57) ABSTRACT

A metal plate (14) is buried in a gasket (12) of a case (10) for accommodating an electric device such as an inverter. The metal plate (14) is connected to a control board (400) in the case (10), and the voltage of the metal plate (14) is determined. A reference voltage is applied to the metal plate (14), and the case (10) is grounded. When the metal plate (14) is brought into contact with the case (10) or disconnected due to a crash, the voltage of the metal plate (14) is thereby changed, and the control board (400) detects a crash, based on the change in the voltage.

5 Claims, 4 Drawing Sheets

(56) References Cited

FOREIGN PATENT DOCUMENTS

| JP | 2002-236979 A | 8/2002 |
| JP | 2004-159439 A | 6/2004 |
| JP | 2005-032830 A | 2/2005 |
| JP | 2008-154315 A | 7/2008 |
| JP | 2010-223654 A | 10/2010 |
| JP | 2012-186887 A | 9/2012 |

* cited by examiner

VEHICLE CRASH DETECTION DEVICE

CROSS REFERENCE TO RELATED APPLICATIONS

This application is a National Stage of International Application No. PCT/JP2011/059515 filed Apr. 18, 2011, the contents of all of which are incorporated herein by reference in their entirety.

TECHNICAL FIELD

The present invention relates to a vehicle crash detection device, and in particular to a vehicle crash detection device that uses a case for accommodating an electric device such as a converter.

BACKGROUND ART

Hybrid vehicles, pure electric vehicles, fuel cell vehicles, and the like, travel while having an electric device such as an inverter operating with power from a high voltage power supply. Therefore, when such vehicles receive a significant impact of a crash or the like that exceeds a tolerable impact level of their electric devices, the electric devices may be damaged, and an electric power at a high voltage may leak, depending on the extent of the damage to the electric system. In order to prevent such an occurrence, it is necessary to promptly detect a crash of a vehicle, to promptly shut down the power supply from a power source when the crash occurs, and to promptly discharge the charges in a high-voltage capacitor.

The Patent Document 1 mentioned below discloses a structure in which a conductive film is attached on the inner surface of the cap of a case for accommodating an inverter, the conductive film being to be electrically disconnected when the cap is deformed. An ECU determines the value I of a current flowing through the conductive film to see whether or not the current value I is substantially zero. When the current value I is substantially zero, it is determined that the inverter has received an impact, and the system main relay is turned off to shut down the power from the battery. In addition, the inverter is stopped operating to put the motor generator in a non-operating state so that no power is generated.

PRIOR ART DOCUMENT

Patent Document

Patent Document 1: Japanese Patent Laid-open Publication No. 2008-154315

DISCLOSURE OF INVENTION

Objects to be Achieved by the Invention

The structure in which a conductive film is attached on the inner surface of the cap of a case for accommodating an electric device such as an inverter or the like is effective as a method for detecting deformation of the cap due to a crash. However, the structure requires a separate step of forming a conductive film, which is a component dedicated to deformation detection. From this point of view, in crash detection through detection of a deformed case, it is desirable to detect a crash without increasing the number of steps and requiring a dedicated component. At the same time, as a crash can be caused from any direction, it is necessary to detect case deformation in any direction, and to stop operation of a high voltage system.

Although it is possible to prevent increase of the number of components when an airbag activation sensor is utilized to stop operation of a high voltage system, this imposes a restriction such that the airbag activation sensor and the case for accommodating an electric device need to be placed on the same line relative to the direction in which the impact is applied.

An object of the present invention is to provide a device for reliably detecting deformation of a case for accommodating an electric device such as an inverter, the deformation being caused by a crash from any direction, to thereby detect the crash.

Means for Achieving the Objects

The present invention relates to a vehicle crash detection device, comprising a case for accommodating an electric device, wherein the case has gaskets provided on a circumference of the case, a conductor provided in the gasket so as to be electrically insulated from the case, and a detection unit for determining an electric conductive state of the conductor to thereby detect a crash.

In one embodiment of the present invention, the gasket may be placed in a flange of the case.

In another embodiment of the present invention, the detection unit may be accommodated in the case.

In another embodiment of the present invention, the vehicle crash detection device may further comprise a reference voltage source for applying a reference voltage to the conductor, the case may be grounded, and the detection unit may detect a crash when the voltage of the conductor is identical to a ground voltage or the reference voltage.

In another embodiment of the present invention, the case may have a grommet, and the conductor may have relatively higher rigidity in a part of the case where the grommet is provided than that in other parts.

Effects of the Invention

According to the present invention, it is possible to detect a crash from any direction. Further, according to the present invention, as the conductor is provided inside the gasket of the case, it is possible to prevent increase in the number of components.

BEST MODE FOR CARRYING OUT THE INVENTION

In the following, an embodiment of the present invention will be described, based on the accompanying drawings, referring to a hybrid vehicle as an example. The present invention, however, is not limited to a hybrid vehicle, but may be similarly applied to any vehicle, such as a pure electric vehicle and a fuel cell vehicle, that travels while driving a motor under control over the power from a battery by an electric device such as an inverter.

1. Complete System Structure

Figure 1:
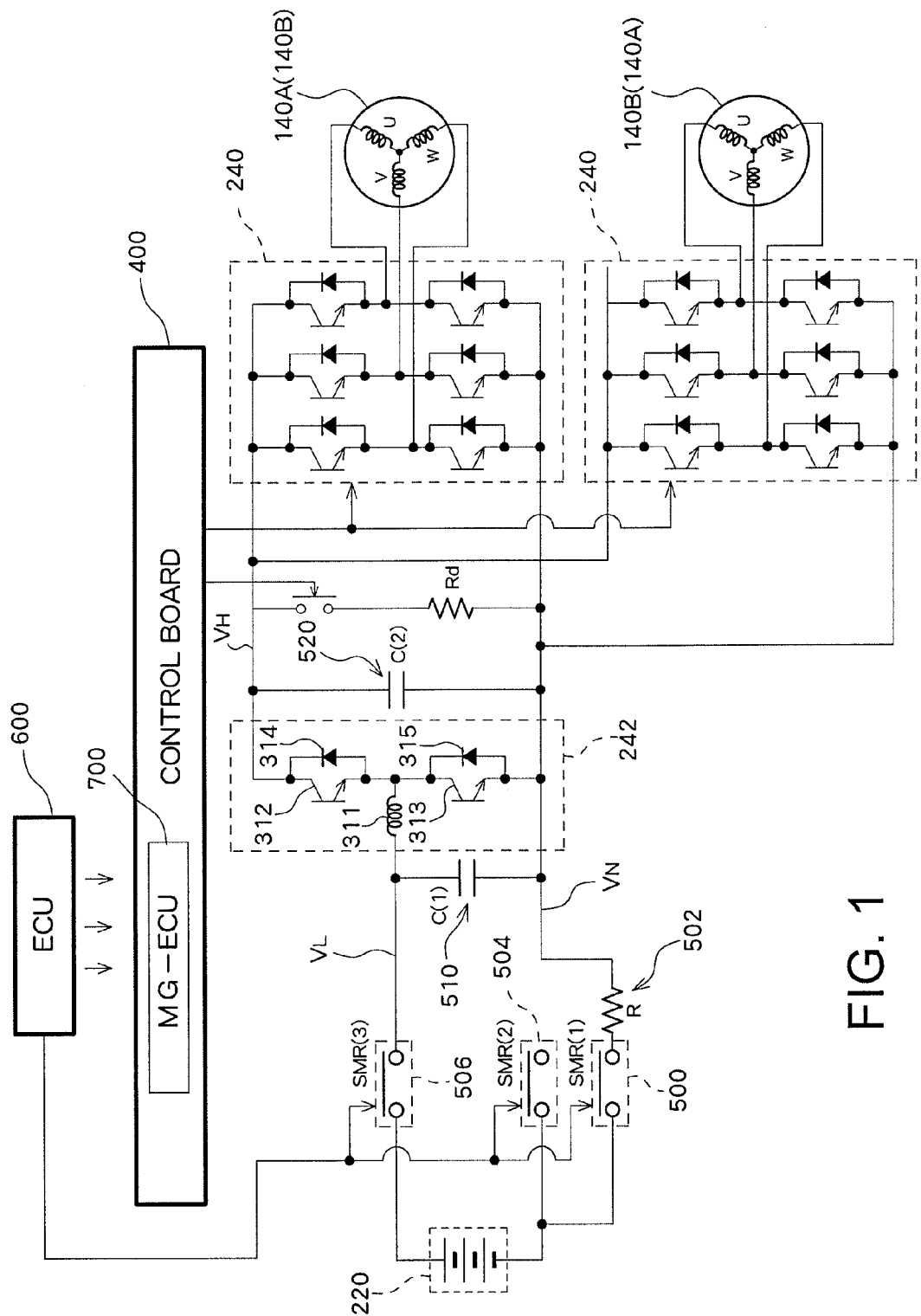
FIG. 1 is a diagram showing a complete system structure in an embodiment.

Initially, a complete structure of the system will be described. The complete system structure is basically identical to the system structure described in Patent Document 1. FIG. 1 shows this system structure.

The system comprises a battery 220, a booster converter 242, an inverter 240, capacitors 510, 520, system main relays SMR 500, 504, 506, a limiting resistor 502, an ECU 600, and a control board 400.

The inverter 240 includes six IGBTs (Insulated Gate Bipolar Transistor) and six diodes that are connected in parallel to the respective IGMTs such that a current flows from the emitter side of the IGBT to the collector side of the same. The inverter 240 causes the motor generator 140 to function as a motor or a generator, based on a control signal from the control board 400, in particular, from the MG-ECU 700 in the control board 400, based on an instruction from the ECU 600. Specifically, when the motor generator 140 functions as a motor, the inverter 240 turns on/off the respective gates of the IGBTs to convert a DC power supplied from the battery 220 into an AC power to supply to the motor generator 140. Meanwhile, when the motor generator 140 functions as a generator, the inverter 240 turns on/off the respective gates of the IGBTs to convert the AC power generated by the motor generator 140 into a DC power to charge the battery 220. The motor generator 140 comprises motor generators 140A, 140B. When the motor generator 140A is for driving, an upper-side inverter 240 functions as a driving inverter, while when the motor generator 140B is for power generation, a lower-side inverter 240B functions as a power generating inverter.

The booster converter 242 includes a reactor 311, transistors 312, 313, and diodes 314, 315. One end of the reactor 311 is connected to the power supply line of the battery 220, while the other end is connected to the middle point between the transistor 312 and the transistor 313. The transistors 312, 313 are connected in series between the positive and negative polarity lines of the inverter 240. The collector of the transistor 312 is connected to the positive polarity line, while the emitter of the transistor 313 is connected to the negative polarity line. Further, between the collector and the emitter of each transistor 312, 313, a diode 314, 315 for supplying a current from the emitter to the collector is connected. The transistors 312, 313 of the booster converter 242 are turned on/off by the control board 400 so that the DC voltage supplied from the capacitor 510 is boosted and supplied to the capacitor 520. The capacitor 520 smooths the DC voltage supplied from the booster converter 242, and supplies the smoothed DC power to the inverter 240. The capacitors 510, 520, both functioning as smoothing capacitors, will be hereinafter collectively referred to as a smoothing capacitor. Further, for convenience, the positive polarity line before boosting by the booster converter 242 will be hereinafter referred to as a VL line, while the positive polarity line and the negative polarity line after boosting by the booster converter 242 will be hereinafter referred to as a VH line and a VN line, respectively.

The ECU 600 controls the inverter 240 and the SMRs 500, 504, 506, based on an ignition switch, a pressed amount of an accelerating pedal, a pressed amount of a brake, detected voltages of the VH and VL lines, or the like.

The booster converter 242, the smoothing capacitor (capacitors 510, 520), the inverter 240, and the control board 400 are accommodated as a power control unit (PCU) in a case, and the case is mounted in the engine compartment or below the rear floor. Electric power resulting from boosting of a high voltage of a few hundreds of volts from the battery 220 by the booster converter 242 is supplied to the inverter 240.

Therefore, when a vehicle receives a significant impact of a crash that exceeds the tolerable impact level of the case, the case is damaged, and electric power at a high voltage may leak from the inverter 240, depending on the extent of the damage.

To address the above, in this embodiment, the control board 400 promptly determines the impact of a crash, and stops operation of a high voltage system.

Specifically, the inverter 240 has a fast discharge circuit comprising a relay and a discharge resistance Rd connected between the VH line and the VN line, and the control board 400 outputs an instruction to turn on the relay of the fast discharge circuit to thereby discharge the charge in the smoothing capacitor.

In the following, a crash detection structure will be described in detail.

2. Details on Crash Detection Structure

A crash detection structure according to this embodiment includes conductors provided around the case for accommodating an electric device such as an inverter, and detects deformation or disconnection of the conductor caused when the case is deformed or damaged due to an impact of a crash, to thereby detect occurrence of a crash. The conductor is provided on a flange, or a projected portion of the case, especially in a gasket of the flange. That is, the case comprises two case components, namely, for example, a cap and a body, and these two components are connected to each other by a gasket to ensure a waterproof seal. The conductor is buried in the gasket. The conductor is in a predetermined electric conductive state in a normal state (in a not-crashed state), and changed into an electric conductive state different from that in a normal state when the conductor is deformed or disconnected due to a crash. By detecting a change in the electric conductive state, deformation or disconnection of the conductor, and thus occurrence of a crash, is detected.

Specifically, the electric conductive state of the conductor includes a current, a voltage, a resistance value, and the like. When a voltage is referred to as an example, the voltage of the conductor is maintained at a predetermined constant voltage in a normal state, and changed into a different voltage upon deformation or disconnection of the conductor. The conductor, being buried in the gasket, is inevitably insulated from the case when the gasket is made of insulating material such as rubber or the like. The conductor may be made of, for example, a metal panel.

In the following, a more specific crash detection structure will be described.

Figure 2:
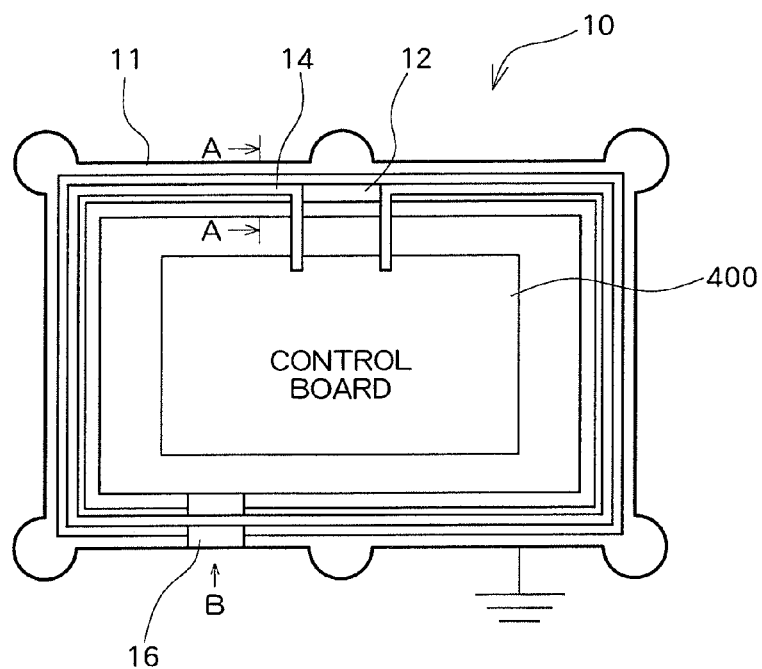
FIG. 2 is a plan view of a case in the embodiment.

FIG. 2 is a plan view of a case 10 for accommodating the smoothing capacitor and the inverter 240. The case 10 has a flange 11 formed on the circumference thereof, and accommodates the control board 400 where the MG-ECU 700 is mounted, in addition to the smoothing capacitor and the inverter 240. The case 10 is composed of two case components, such as an upper case and a lower case, or a cap and a body, and the two case components are connected to each other by a gasket 12. The gasket 12 is provided on the flange 11. Metal plates 14, or conductors, are each provided in the gasket 12, and placed surrounding the circumference of the case 10. As the metal plate 14 is provided in the gasket 12 made of rubber or the like, the metal plate 14 is electrically insulated from the case 10 by the gasket 12. The respective two ends of the metal plate 14 are electrically connected to the control board 400 via a lead portion, a wire harness, or the like.

The case 10 is connected to the body earth via a bracket. An external control line and a cooling pipe grommet 16 are formed on a part of the case 10.

Figure 3:
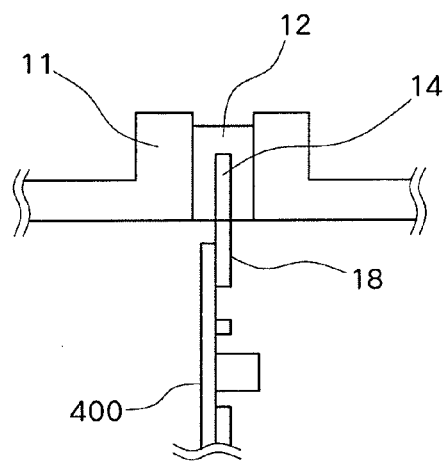
FIG. 3 is a cross sectional view along the line A-A in FIG. 2.

FIG. 3 is a cross sectional view along the line A-A in FIG. 2. The gasket 12 is provided on the flange 11 of the case 10 to seal the case 10, and the metal plate 14 is buried in the gasket 12. The metal plate 14 and the case 10 are insulated from each other by the gasket 12. An end of the metal plate 14 is connected to the control board 400 via a lead portion 18, so that the electric conductive state, specifically, the voltage, of the metal plate 14 is supplied to the MG-ECU 700 of the control board 400. The MG-ECU 700 including a microprocessor determines the voltage of the metal plate 14, and compares the voltage determined with a predetermined threshold value to determine whether or not there has been a crash. That is, the flange 11 of the case 10 is deformed due an impact of a crash, and the deformed flange 11 causes the metal plate 14 to be deformed so as to contact the case 10 or be disconnected. Then, the control board 400 detects a change in the voltage of the metal plate 14 caused by the impact of the crash, to thereby determine whether or not there has been a crash.

Figure 4:
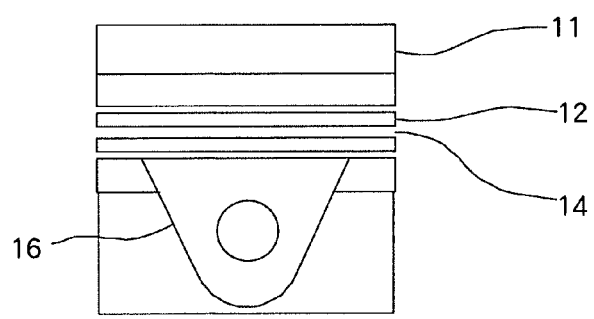
FIG. 4 is an enlarged partial view viewed from the direction B in FIG. 2.

FIG. 4 shows placement of a grommet 16, viewed from the direction B in FIG. 2. The grommet 16 is a ring-shaped rubber component for guiding an external control line and a cooling pipe into the inside of the case 10. When the rubber gasket 12 abuts on the rubber grommet 16, a sufficient surface pressure necessary for sealing may not be able to be maintained with such rubber-to-rubber contact. However, in this embodiment, as the metal plate 14 is buried in the gasket 12, and the gasket 12 can thus have increased rigidity, a sufficient surface pressure necessary for sealing can be readily obtained even from the contact between the gasket 12 and the grommet 16. That is, the metal plate 14 in this embodiment has a function of operating as a sensor for detecting a crash from any direction and also a function of improving the rigidity of the gasket 12 to ensure sealing propriety.

Figure 5:
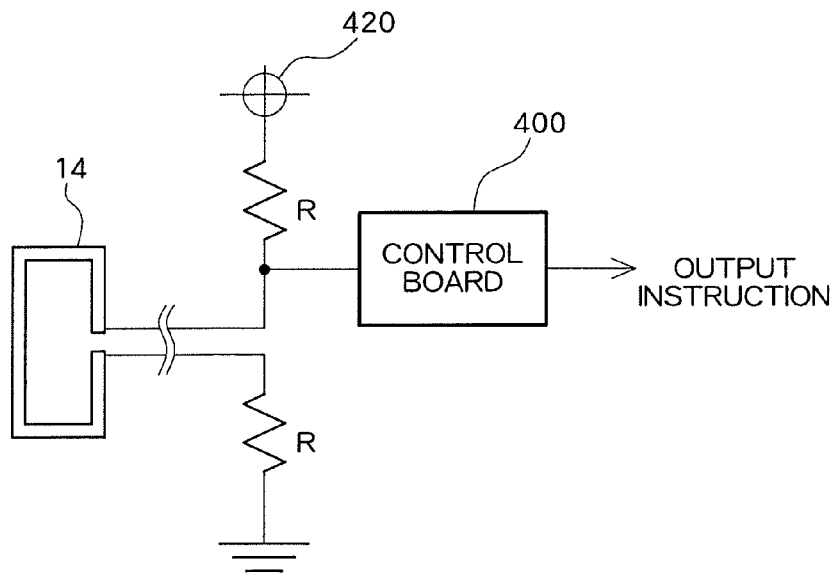
FIG. 5 is a diagram showing a circuit structure of a crash detection device in the embodiment.

FIG. 5 is a circuit diagram of a crash detection device according to this embodiment. One end of the metal plate 14 placed around the flange 11 of the case 10 is connected to a reference power supply 420 via a voltage dividing resistance R, and the other end is connected to the body earth via a voltage dividing resistance R. The control board 400 is connected to the point where the voltage dividing resistance R is connected to the metal plate 14, and the voltage at the connection point is supplied to the control board 400.

Suppose that the voltage (reference voltage) of the reference power supply 420 is 5 V. In a normal state, the middle potential of the reference voltage (2.5 V) is supplied to the control board 400. Meanwhile, when a crash occurs and the flange 11 is thereby deformed due to the impact of the crash and the metal plate 14 is thereby disconnected, a voltage 5 V, different from that in a normal state, is supplied to the control board 400. Accordingly, based on the change in the potential detected, the control board 400 detects occurrence of a crash, and outputs an instruction to turn on the relay of the fast discharge circuit.

Meanwhile, there may be a case in which a crash causes only damage to the gasket 12 but not disconnection of the metal plate 14, depending on the extent of the impact. Even in such a case as well, the damaged gasket 12 causes the metal plate 14 to contact the case 10, and the insulating state is thus destroyed. Consequently, a body earth voltage (0 V) different from the voltage in a normal state is supplied to the control board 400, which thus can similarly detect occurrence of a crash.

That is, in this embodiment, occurrence of a crash can be reliably detected not only in a case where the metal plate 14 is disconnected but also in a case where the metal plate 14 is not disconnected, in which the metal place 14 may or may not be disconnected due to difference in an impact of a crash. This can improve reliability in crash detection.

Note that besides being formed as a plane panel, the metal plate 14 may preferably be formed into a structure that is readily disconnected upon receipt of an impact in excess of a predetermined value.

Figure 6:
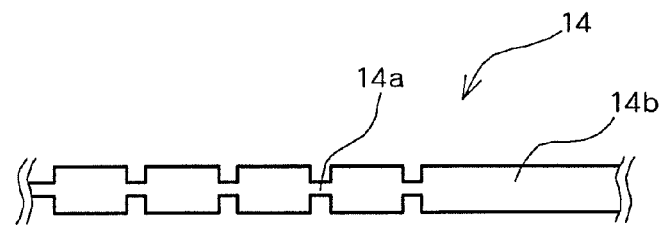
FIG. 6 is a plan view of a metal panel in the embodiment.
Figure 7:
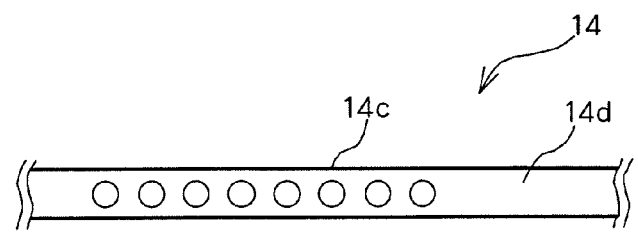
FIG. 7 is another plan view of a metal panel in the embodiment.

FIGS. 6 and 7 show one example of the metal plate 14. In FIG. 6, the metal plate 14 has a narrower width portion 14a that occurs in every predetermined cycle, and a constant width portion 14b. The narrower width portion 14a is cyclical, and prone to be disconnected upon receipt of an impact. Meanwhile, the constant width portion 14b can improve the rigidity of the gasket 12 when being placed in a position, for example, where the grommet 16 is provided, so that a predetermined surface pressure can be ensured.

In FIG. 7, the metal plate 14 has a portion 14c having an opening of a predetermined diameter formed therein and a portion 14d having no such opening. The portion 14c has less strength in the position of such an opening, and thus is prone to be disconnected upon receipt of an impact. Meanwhile, the portion 14d having no opening can have improved rigidity of the gasket 12 when being placed in a position where the grommet 16 is provided, so that a predetermined surface pressure can be ensured.

Figure 8:
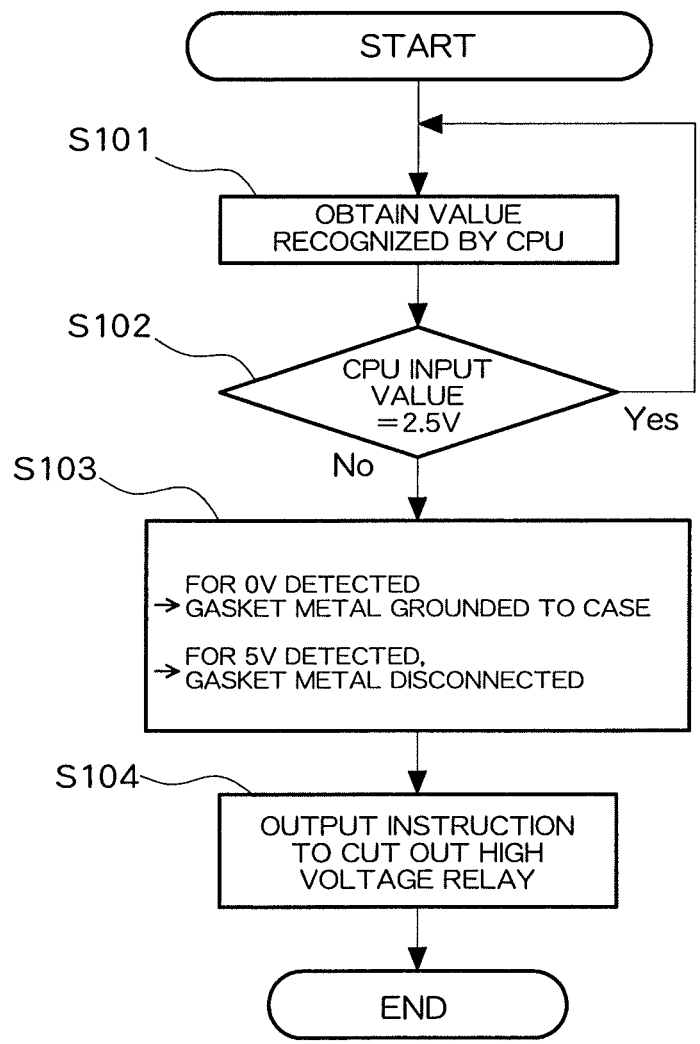
FIG. 8 is a flowchart of a process in the embodiment.

FIG. 8 is a flowchart of a crash detection process carried out in this embodiment. Specifically, the MG-ECU 700 (denoted simply as CPU in the diagram) in the control board 400 obtains the voltage of the metal plate 14 (S101), and determines whether or not the obtained voltage value is a predetermined middle value, such as, for example, 2.5 V described above (S102). When the obtained voltage value is 2.5 V, non-occurrence of a crash is determined, and the process at S101 is carried out again.

Meanwhile, when the obtained voltage value is not 2.5 V, whether the obtained voltage value is 0 V or 5 V is determined. When the obtained voltage value is 0 V, it is concluded that the metal plate 14 in the gasket 12 is brought into contact with the case 10 (grounded) due to a crash, and therefore, occurrence of a crash is determined. Further, when the obtained voltage value is 5 V, it is concluded that the metal plate 14 in the gasket 12 is disconnected due to a crash, and therefore occurrence of a crash is similarly determined (S103).

Upon determination of occurrence of a crash, the MG-ECU 700 in the control board 400 outputs an instruction to turn on the relay (high voltage cut-out relay) of the fast discharge circuit (S104).

As the metal plates 14 are provided to the flange 11 of the case 10 so as to surround the case 10 in this embodiment, as described above, a crash from any direction can be detected. Moreover, as the flange 11 of the case 10 is first to receive the impact of a crash, provision of the metal plate 14 on the flange 11 enables reliable and prompt detection of a crash.

In this embodiment, as the metal plate 14 is buried in the gasket 12, and therefore, the metal plate 14 which functions as a crash detecting sensor can be formed integral with the gasket 12, it is possible to prevent increase in the number of components and also increase of the volume.

When two or more sensors are provided to detect a crash from any direction, a wire for connecting each sensor and the control board 400 is necessary. This increases and complicates the wire harness. In this embodiment, however, as it is only necessary to connect a single metal plate 14 to the control board 400, a simpler structure can be resulted.

As the metal plate 14 is buried in the gasket 12, it is possible to improve the rigidity of the rubber gasket 12 so that a sufficient surface pressure can be ensured in a position where the gasket 12 abuts on the grommet 16, and to ensure a good seal.

3. Modified Examples

While the case 10 is mounted in the engine compartment or below the rear floor of the vehicle, as described above, the flange 11 may be placed either on a horizontal or vertical plane. For example, in mounting the case 10 in the engine compartment, the case 10 may be placed near the radiator support so that the radiator support moves upon receipt of an impact of a crash so as to contact the flange 11 of the case 10.

Further, although the metal plate 14 is used as a conductor in this embodiment, this is not limiting, and any electric conductive material can be used.

Further, although the voltage of the metal plate 14 is determined to detect occurrence of a crash in this embodiment, a current or a resistance value may be determined instead of the voltage. Anyhow, change in the electric conductive state of the conductor in the gasket 12 is utilized in crash detection.

Further, although the metal plates 14 are each placed in the gasket 12 so as to surround the entire circumference of the case 10 in this embodiment, the metal plates 14 may each be placed in the gasket 12 so as to surround a half circumference or a part of the case 10 instead. Obviously, it is desirable to place the metal plates 14 around the entire circumference of the case 10 in order to detect occurrence of a crash from any direction, but in order to detect a crash from, for example, the forward or lateral direction, the metal plates 14 may be positioned in the case 10 only in corresponding positions. That is, in this embodiment, the metal plates 14 need not be provided in all positions in the case 10 where the gaskets 12 are present, but only in some of the positions where the gaskets 12 are present.

REFERENCE NUMERALS

10 case, 12 gasket, 14 metal plate, 16 grommet, 20 battery, 140 motor generator, 240 inverter, 242 booster converter, 400 control board, 510, 520 capacitor (smoothing capacitor), 600 ECU, 700 MG-ECU.

What is claimed is:

1. A vehicle crash detection device, comprising:
   a case for accommodating an electric device,
   wherein the case has
      gaskets provided on a circumference of the case,
      a conductor provided in the gasket so as to be electrically insulated from the case, and
      detection means for determining an electric conductive state of the conductor to thereby detect a crash,
   the vehicle crash detection device further comprising a reference voltage source for applying a reference voltage to the conductor, wherein
   the case is grounded, and
   the detection means detects a crash when a voltage of the conductor is identical to a ground voltage or the reference voltage.

2. The vehicle crash detection device according to claim 1, wherein the gasket is placed in a flange of the case.

3. The vehicle crash detection device according to claim 1, wherein the detection means is accommodated in the case.

4. The vehicle crash detection device according to claim 1, wherein
   the case has a grommet, and
   the conductor has relatively high rigidity in a part of the case where the grommet is provided compared to in other parts.

5. The vehicle crash detection device according to claim 1, wherein the conductor is a metal plate.

* * * * *